United States Patent
Johansson

(10) Patent No.: US 11,626,153 B2
(45) Date of Patent: Apr. 11, 2023

(54) LOW POWER STATIC RANDOM-ACCESS MEMORY

(71) Applicant: OmniVision Technologies, Inc., Santa Clara, CA (US)

(72) Inventor: Robert Johansson, Oslo (NO)

(73) Assignee: OmniVision Technologies, Inc., Santa Clara, CA (US)

(*) Notice: Subject to any disclaimer, the term of this patent is extended or adjusted under 35 U.S.C. 154(b) by 18 days.

(21) Appl. No.: 17/340,783

(22) Filed: Jun. 7, 2021

(65) Prior Publication Data

US 2022/0392512 A1    Dec. 8, 2022

(51) Int. Cl.
| | |
|---|---|
| G11C 7/10 | (2006.01) |
| G11C 11/4074 | (2006.01) |
| G11C 11/4076 | (2006.01) |
| H03K 23/00 | (2006.01) |
| G11C 11/4093 | (2006.01) |

(52) U.S. Cl.
CPC ........ *G11C 11/4074* (2013.01); *G11C 7/1087* (2013.01); *G11C 11/4076* (2013.01); *G11C 11/4093* (2013.01); *H03K 23/005* (2013.01)

(58) Field of Classification Search
CPC .............. G11C 11/4074; G11C 7/1087; G11C 11/4076; G11C 11/4093; H03K 23/005
USPC ................................................. 365/205, 226
See application file for complete search history.

(56) References Cited

U.S. PATENT DOCUMENTS

| | | | |
|---|---|---|---|
| 2016/0134290 A1* | 5/2016 | Pinoncely | H03K 4/06 377/34 |
| 2017/0011680 A1* | 1/2017 | Miyata | G09G 3/3607 |
| 2021/0185262 A1* | 6/2021 | Osawa | A61B 1/05 |

(Continued)

FOREIGN PATENT DOCUMENTS

| | | | | |
|---|---|---|---|---|
| CN | 101779234 A | * | 7/2010 | ......... G09G 3/3629 |
| DE | 112012002223 T5 | * | 2/2014 | ............. G06F 5/12 |
| JP | 2006262049 A | * | 9/2006 | |

*Primary Examiner* — Michael T Tran
(74) *Attorney, Agent, or Firm* — Cozen O'Connor

(57) ABSTRACT

A low power SRAM (static RAM) for an image sensor includes a voltage generation circuit for providing a positive supply voltage $V_P$ and a negative supply $V_N$, wherein $VDD > V_p > V_n > V_{gnd}$; a plurality of memory cells coupled to a respective plurality of column sense lines in a pixel array, the plurality of memory cells receiving differential inputs dp and dn; and a Gray counter coupled to switchably couple $V_P$ and $V_N$ to the differential inputs dp and dn of the plurality of memory cells. A method of operating an image sensor with a low power SRAM includes acquiring an image by the image sensor; generating $V_P$ and $V_N$ such that $V_{DD} > V_P > V_N > V_{gnd}$; receiving an output g of a column of pixels at a clock input of a memory cell; and switchably coupling $V_P$ and $V_N$ to the differential inputs dp and dn of a plurality of memory cells in the SRAM according to a codeword from a Gray counter.

20 Claims, 7 Drawing Sheets

(56) References Cited

U.S. PATENT DOCUMENTS

2021/0241679 A1* 8/2021 Haas .................. G09G 3/32
2022/0392512 A1* 12/2022 Johansson .......... G11C 11/4074

* cited by examiner $t < T_0, t > T_4$ $T_0 \leq t < T_1$ $T_1 \leq t < T_2$ $T_2 \leq t < T_4$

LOW POWER STATIC RANDOM-ACCESS MEMORY

BACKGROUND

Image sensors are widely used in many devices, from mobile devices and cameras to doorbells and other sensors. Most fields of endeavor have found a benefit in including image sensors, for example, including automotive, manufacturing, security systems and medical applications, among many others. The extensive use of image sensors has led to continued improvement in the technology to satisfy demands for higher resolution and lower power consumption.

Image sensors include an array of pixels that acquire image data of a scene using photodiodes or other imaging sensors, then store the pixel values to a memory. Typically, the memory is arranged as a row of memory cells in a memory bank. Each memory cell is coupled to a column of pixels in the array to receive and store data.

Increasing frame rates and image resolution also increase the rate at which data is transferred from the pixel array to the memory. Typically, the data transfer rates are influenced by the operating frequency of the memory cells, which impacts the power consumed by the memory cells. This power can be represented by the equation:

$$P = f C_P V_{DD}^2 \qquad (1)$$

where f represents a counter clock frequency, $C_P$ represents metal wire capacitance and $V_{DD}$ represents digital power supply voltage. Reducing power consumption is highly desirable as image sensors are miniaturized and integrated into an ever-increasing variety of devices and applications.

SUMMARY OF THE EMBODIMENTS

In a first aspect, a low power SRAM includes a Gray counter to switchably couple positive and negative supply voltages with a small differential to differential inputs of memory cells storing pixel values from a pixel array.

In a further aspect, an image sensor includes a low power SRAM which includes a voltage generation circuit for providing a positive supply voltage $V_P$ and a negative supply $V_N$, wherein $VDD > V_P > V_N > V_{gnd}$; a plurality of memory cells coupled to a respective plurality of column sense lines in a pixel array, the plurality of memory cells receiving differential inputs dp and dn; and a Gray counter coupled to switchably couple $V_P$ and $V_N$ to the differential inputs dp and dn of the plurality of memory cells.

In another aspect, a method of operating an image sensor with a low power SRAM includes acquiring an image by the image sensor; generating $V_P$ and $V_N$ such that $V_{DD} > V_P > V_N > V_{gnd}$; receiving an output g of a column of pixels at a clock input of a memory cell; and switchably coupling $V_P$ and $V_N$ to the differential inputs dp and dn of a plurality of memory cells in the SRAM according to a codeword from a Gray counter.

DESCRIPTION OF THE EMBODIMENTS

A low power Static Random-Access Memory (SRAM) includes a plurality of memory cells for storing pixel values from an image sensor. A common counter feeds a Gray code to the memory cells to capture a pixel value, the memory cells storing the pixel value when a ramp voltage passes a column voltage from a pixel array. Power consumption by the SRAM is reduced by generating two reference voltages that are lower than the digital power supply voltage, and using them as a differential input to the memory cells as controlled by the Gray code counter.

Figure 1:
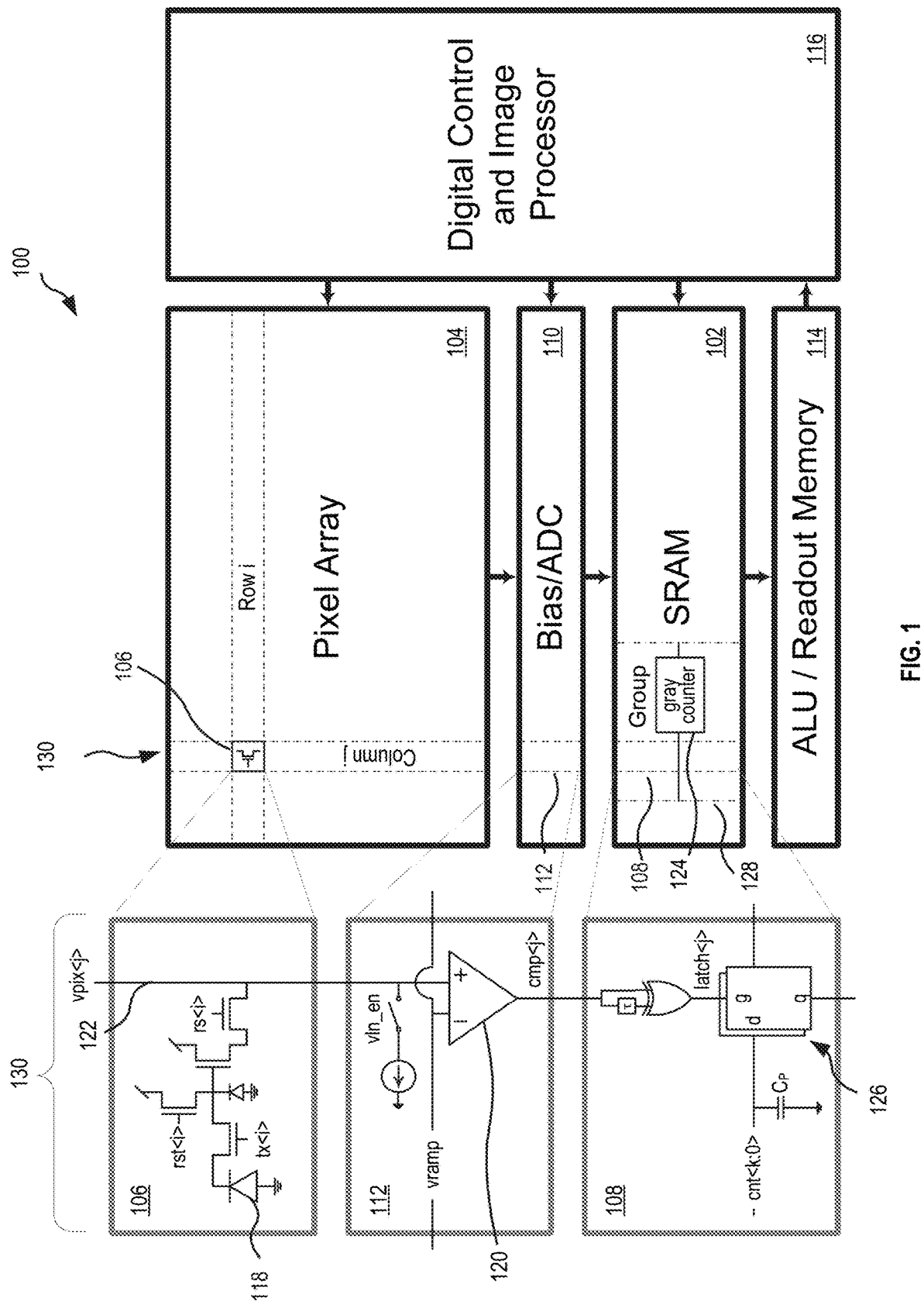
FIG. 1 is a schematic diagram of an image sensor with a low power SRAM, in embodiments

FIG. 1 is a schematic diagram of an exemplary image sensor 100, in embodiments. Pixel array 104 collects light samples and stores them in SRAM 102 using analog-to-digital converter (ADC) 110. Data saved in SRAM 102 is readout by arithmetic logic unit (ALU)/Readout Memory 114 and sent to digital control and image processor 116, which also provides control signals for image sensor 100.

Pixel array 104 includes rows(i) and columns(j) of pixels 106. When image sensor 100 is exposed to light, pixels 106 acquire voltage values that are converted to digital values by ADC 110 comprising a comparator circuit 112 for each column bitline of pixel array 104. These digital values are saved in memory cells 108 in SRAM 102. SRAM 102 is a line memory, which stores one row(i) of A/D converted pixel values. In embodiments, digital control and image processor 116 represents any type of programmable logic device that can generate control signals.

The left side of FIG. 1 illustrates expanded versions of circuitry in column 130 of image sensor 100. Similar circuitry would be used across all columns in image sensor 100. Pixel 106 includes a photodiode (PD) 118 which acquires a voltage when exposed to light. photo-generated electrons in each of the plurality of pixel cells are transferred from a photodiode (PD) to a floating diffusion (FD) in the pixel cell for subsequent read out. A transfer (TX) transistor coupled between the PD and the FD is switched on and off under the control of a voltage pulse asserted to the TX gate terminal to enable this charge transfer. The image signal is amplified by a source follower (SF) transistor. When a row select (RS) transistor is enabled, the amplified image signal is transferred to output line 122, called a column bitline, of the pixel cell. The pixel circuit 106 shown in FIG. 1 is representative and other pixel circuits with more or fewer transistors, for example, are contemplated.

An analog image signal on output line 122 is fed to ADCs 110 to convert the signal to a digital image signal. In some embodiments, comparator circuit 112 includes comparator 120 which compares the analog signal on output line 122 with a ramp voltage $V_{ramp}$. provided by a ramp generator. When comparator 120 detects that the voltage ramp of $V_{ramp}$ passes the analog signal on output line 122, it generates a gating signal g that causes the value of gray counter 124 to be captured in memory cell 108.

In embodiments, memory cell 108 includes k+1 latches<k:0> 126 corresponding to the number of bits cnt<k:

0> in gray counter 124. Each latch<k> is connected to bit cnt<k>. The output of comparator 120 serves as a gating input to latches<k:0> 126. The lines from gray counter 124 to latches 126 have a capacitance $C_P$ which contributes to the power consumed by memory cell 108 in accordance with equation (1).

After the value of a pixel in column<j> is captured, the comparator 120 connects latch 126 to the next pixel in the column, and the process repeats until voltage values of all the pixels of in column<j> are captured. SRAM 102 is a line memory, which stores one full row of A/D converted pixel values. In embodiments, pixel values are read from image sensor 100 using Digital Correlated Double Sampling (DCDS), although other methods are used in other embodiments. For purposes of illustration, a DCDS method includes the following steps:

1) Read out pixel 106 reset voltage to bitline 122.
2) A/D convert the value. When the voltage $V_{ramp}$ has passed from high to low in comparator circuit 112, the latches<k:0> 126 will contain a gray coded value corresponding to the reset voltage for column<j>.
3) Transfer the entire row of A/D values to ALU 114, and convert from gray to binary code, then subtract this value from 0.
4) Pulse tx<i> and read out the pixel signal value to bitline 122.
5) A/D convert the value in ADC 110. When the voltage $V_{ramp}$ has passed from high to low, the latches<k:0> 126 will contain a gray coded value corresponding to the signal voltage for column<j>.
6) Transfer the entire row of A/D values to ALU 114, and convert from gray to binary code, then add this value to the already present reset value.
7) The resulting values in the readout memory is a digital representation of $(V_S-V_R)$, where $V_R$ is the pixel reset voltage, and $V_S$ the pixel signal voltage, at the bitline 122 for each column.
8) The readout from the readout memory to the "digital core" 116 is done column by column when row<j+1> is A/D converted and read out. A similar process occurs across all columns of image sensor 100. In some embodiments, individual memory cells 108 may be combined into groups of M memory cells 128 where M may be 128, for example.

Figure 2A:
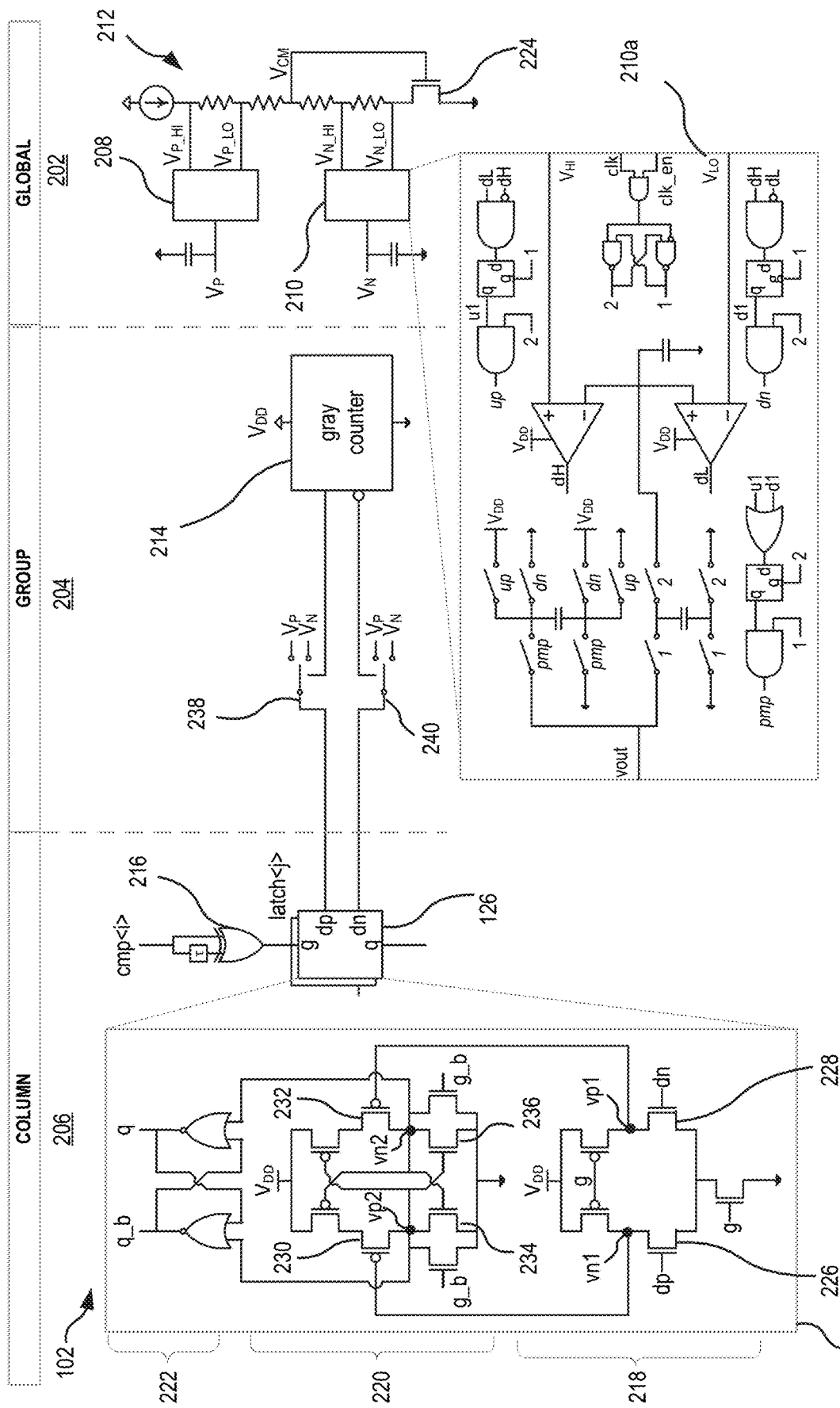
FIG. 2A is a more detailed schematic diagram of the SRAM of FIG. 1 using NMOS transistors, in embodiments.
Figure 2B:
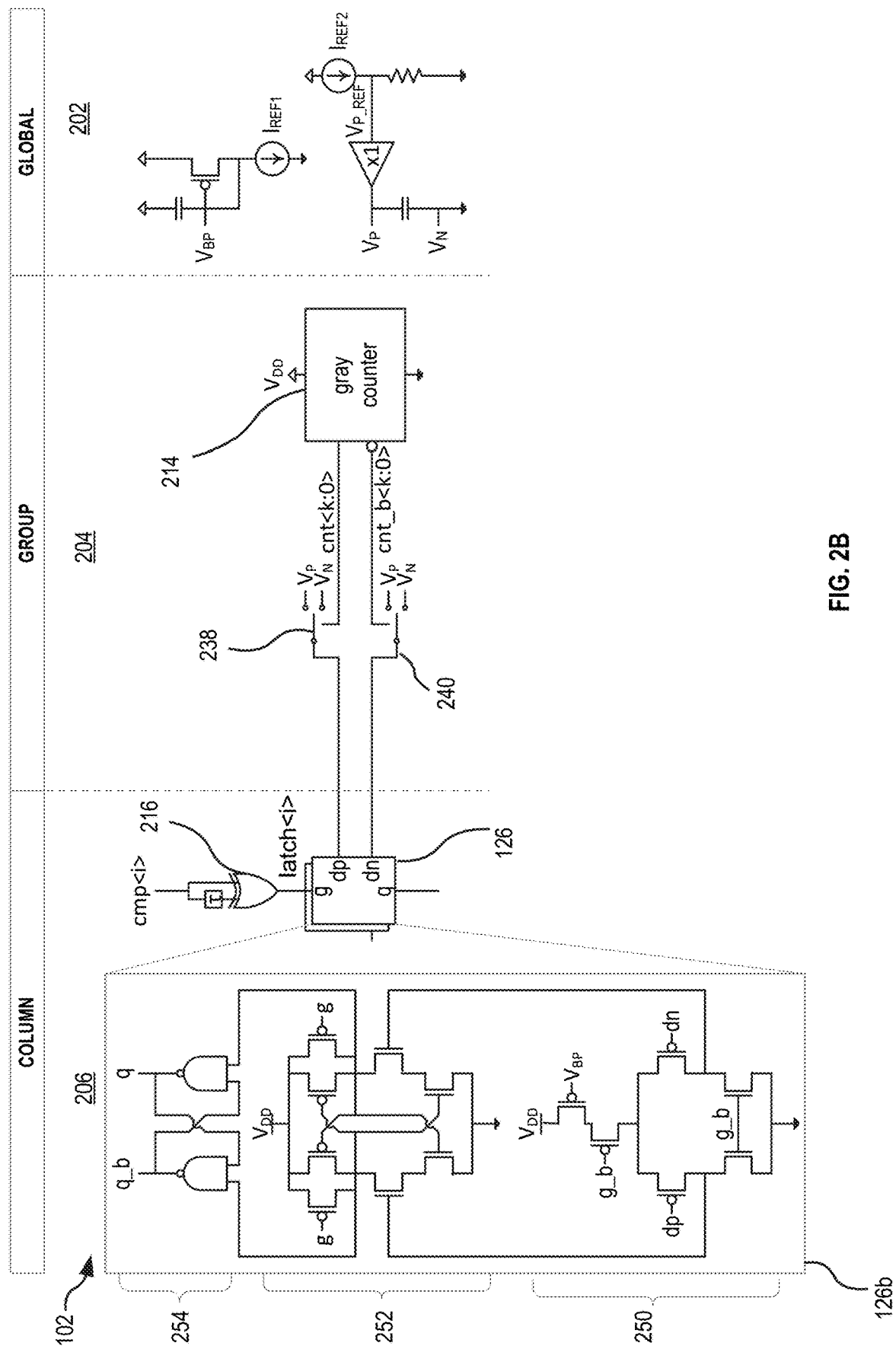
FIG. 2B is a schematic diagram of the SRAM of FIG. 1 using PMOS transistors, in embodiments.
Figure 2C:
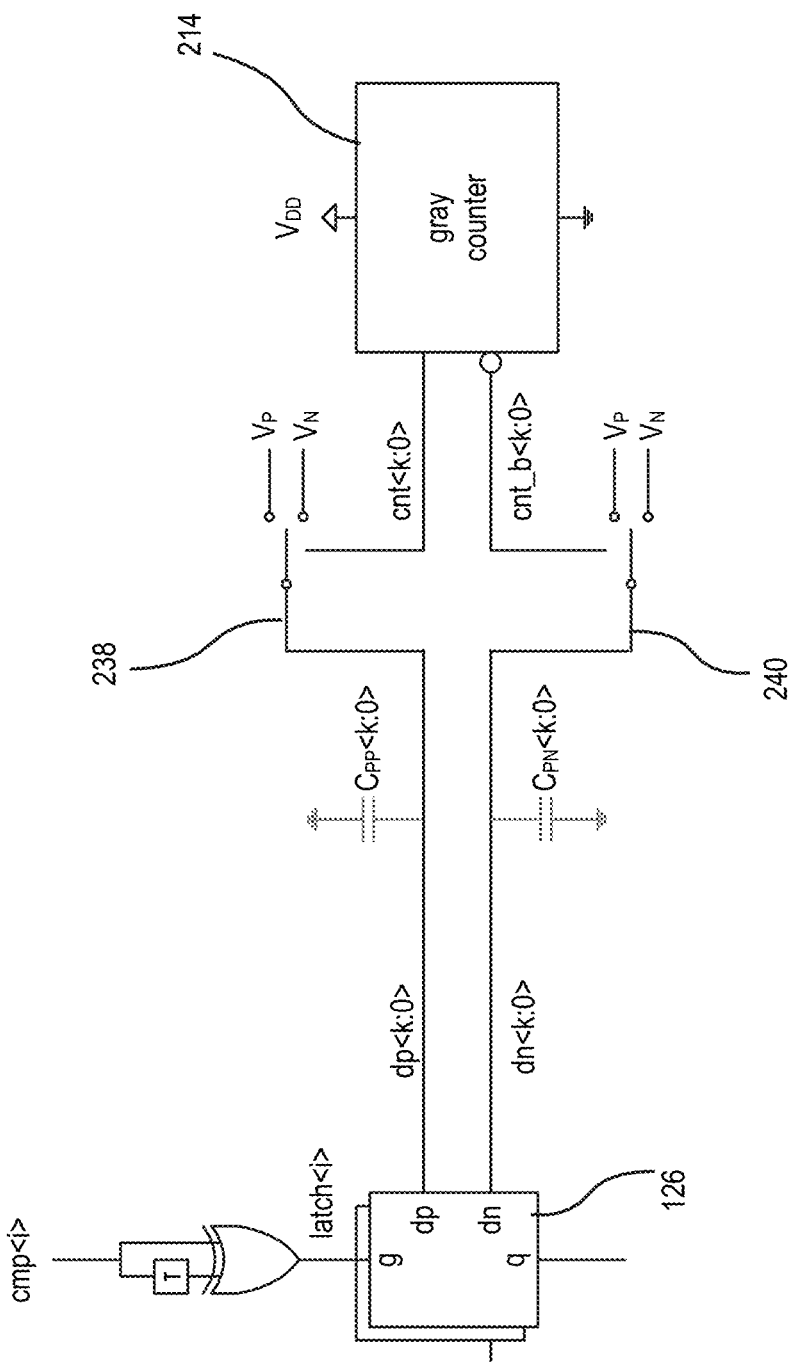
FIG. 2C is a more detailed schematic diagram of the counter circuit of FIGS. 2A and 2B, in embodiments.

FIGS. 2A-2C show SRAM 102 in more detail. FIG. 2A shows an embodiment of SRAM 102 using NMOS transistors. FIG. 2B shows an embodiment of SRAM 102 using PMOS transistors. FIG. 2C shows a more detailed view of counter circuit 204. FIGS. 2A-2C are best viewed together in the following description.

The power consumed by SRAM 102 may be reduced by using differential inputs to latches 126 from gray counter 214. As shown in more detail in FIGS. 2A-2C, outputs from gray counter 214 are used to switch between voltages $V_P$ and $V_N$ as differential inputs to latches 126. Voltages $V_P$ and $V_N$ are generated from $V_{CM}$ such that $V_P>V_N$ and $V_P-V_N$ is approximately 100 mV. In embodiments, $V_{CM}$ is approximately one NMOS $V_T$ above ground and latches 126 use NMOS input devices. In another embodiment of FIG. 2A, $V_{CM}$ is approximately one NMOS $V_T$ below $V_{DD}$ and latches 126 use PMOS input devices.

The lines from the switches to latches 126 have capacitance $C_{pp}$ and $C_{pn}$ resulting in power consumed by memory cell 108 in accordance with equation (2):

$$P=2fC_P(V_P-V_N)V_{CM} \quad (2)$$

where f represents a counter clock frequency, $C_P$ represents metal wire capacitance and $V_P$ represents positive supply voltage and $V_N$ represents negative supply voltage. As shown in FIG. 2C, each wire from Gray counter 214 to latch 126 has a capacitance represented as $C_{pp}$ and $C_{pn}$. Equation (2) assumes that $C_P=C_{pp}=C_{pn}$ where $C_{pp}$ and $C_{pn}$ are metal wire capacitances for dp and dn. Thus, equation (2) uses 2× capacitive load. In embodiments, this assumption may result in a value that is somewhat larger than the real case, since the latch load in the single ended case consists of two transistors (the gates of an NMOS and a PMOS transistor), but only one transistor in the differential case (the NMOS input gate).

FIG. 2A is a more detailed schematic diagram of SRAM 102 of FIG. 1 using NMOS transistors, in embodiments. A voltage generation circuit 202 generates voltages $V_P$ and $V_N$ from a common mode voltage $V_{CM}$. In embodiments, voltage generation circuit 202 includes charge pumps 208 and 210 and a voltage divider 212 but other circuits for generating $V_P$ and $V_N$ are contemplated including, for example any type of amplifier with a gain from substantially one to substantially two, such as a source follower, any voltage buffer, a low-dropout regulator, a charge pump or any switched capacitor circuit.

Reference voltages $V_{P\_HI}$, $V_{P\_LO}$, $V_{N\_HI}$ and $V_{N\_LO}$ are generated by tapping a system digital-to-analog convertor (DAC) fed through voltage divider 212. Charge pumps 208 and 210 buffer the reference voltages $V_{P\_HI}$, $V_{P\_LO}$, $V_{N\_HI}$ and $V_{N\_LO}$, which are used in pairs to generate hysteresis, so there is a voltage dead zone where the charge pump is not pumping. Other types of buffers may be used, such as source followers or low-dropout (LDO) regulators. In embodiments, $V_P-V_N$ is approximately 100 mV but this value depends on the offset of latch 126. It may be more or less than 100 mV. A representative circuit diagram for charge pump 210 is shown at 210a but other circuits are contemplated. In embodiments, charge pumps 208 and 210 are switched capacitor circuits.

Counter circuit 204 includes a Gray counter 214 that generates a Gray codeword cnt<k:0>. A Gray codeword is a representation of binary code where any two successive values in a consecutive order differ in only one digital bit. When used in digital counters, Gray codewords limit the number of valid transitions among all binary bits between any two successive values in an ordering system to one. The minimized number of valid bit transitions of Gray counters results in less power consumption in drivers coupling the gray counter to memory inputs compared to binary counters and avoids the possibility of capturing an invalid code in the memory as codewords transition from one codeword to the next. Gray counter 214 starts to count when $V_{ramp}$ begins. At the point where $V_{ramp}$ and the image signal on output line 122 are the same, the signal cmp<j> is generated and the value of Gray counter 214 is latched in memory cell 206 as a digital representation of the analog image signal captured by pixel 106.

In embodiments, voltage generation circuit 202 is global relative to SRAM 102. Gray counter 214 is shared among a group M of memory cells 206. In further embodiments, the lowest bits of gray counter 214 is shared among a group of memory cells 206, with a global counter providing more significant bits. In yet further embodiments, one Gray counter 214 is shared with all memory cells 206 in SRAM 102. Gray counter 214 counts on both clock edges. The output of Gray counter 214 determines, for input levels for each of the k+1 latches in column j, if dp should be connected to $V_P$ or $V_N$ using switch 238. The word cnt_b<k:0> is the bitwise inverse of cnt<k:0>, which does the same for dn using switch 240. The outputs dp and dn from counter circuit 204 provide a differential input to latch 126.

Memory cell 206 includes logic circuit 216 and latches<k:0>126. A more detailed circuit diagram 126a of latches<k:0>126 is shown at the left side of FIG. 2A. In embodiments, latch 126 is a one-bit differential latch including dynamic amplifier 218, regenerative latch 220 and SR-latch 222. Differential signals dp and dn are received by dynamic amplifier 218. As will be described in more detail below, when gating signal g switches from low to high, discharging nodes vn1 and vp1 will cause regenerative latch 220 to drive nodes vp2 and vn2 to opposite logical levels, and update SR-latch 222.

Latch 126 converts a small differential input voltage, $V_P - V_N$, into the full swing output voltage (with logical levels 0 or $V_{DD}$). Dynamic amplifier 218 reduces the latch offset and the amount of voltage kickback at dp/dn, when the latch flips (for example q goes from 0 to $V_{DD}$, and q_b goes from $V_{DD}$ to 0). In embodiments, this is accomplished with just regenerative latch 220.

In each column<j> there are k+1 latches 126 labeled from 0 to k. The dp input of latch<0> is connected to switch 238, which switches between $V_P$ or $V_N$. Switch 238 is controlled by cnt<0>. The dn input of latch<0> is connected to a similar switch 240 controlled by cnt_b<0>. The same scheme continues, so the dp input of latch<k> is connected to a switch controlled by cnt<k>. The wires dp<k:0> and dn<k:0> are shared by M columns, where M is the size of the group, for example, M=128. The signals cnt<k:0> and cnt_b<k:0> switch with high speed and full logic voltage swing, but the capacitive load is small. The wires dp<k:0> and dn<k:0> also switch with high speed, but only very small voltage swing, since the capacitive load is large.

FIG. 2B shows an embodiment of SRAM 102 where latch 126 is implemented using PMOS transistors. In embodiments, $V_P/V_N$ is a differential voltage where $V_{CM}=V_P/2$, $V_N=0V$ and latch 126 uses PMOS input devices as shown. Therefore, voltage generation circuit 202 only generates one voltage, $V_P$. In a further embodiment of FIG. 2B, $V_P/V_N$ is a differential voltage where $V_{CM}=(V_{DD}+V_N)/2$, $V_P=V_{DD}$ and latch 126 uses NMOS input devices.

The buffering of $V_{P\_REF}$, to generate $V_P$, could be done using any type of amplifier with a gain from substantially one to substantially two, for example, a source follower, any voltage buffer, a low-dropout regulator, a charge pump or any switched capacitor circuit. Bias voltage $V_{BP}$ is used in voltage generation circuit 202 and dynamic amplifier 250 to control the current of the dynamic amplifier, which determines the speed and dynamic gain. Latch 126 with PMOS transistors is shown in more detail in circuit diagram 126b. Dynamic amplifier 250 received differential inputs dp and dn as well as bias voltage $V_{BP}$. Regenerative latch 252 will drive inputs to SR-latch 254 to opposite levels, which will update SR-latch.

Figure 3:
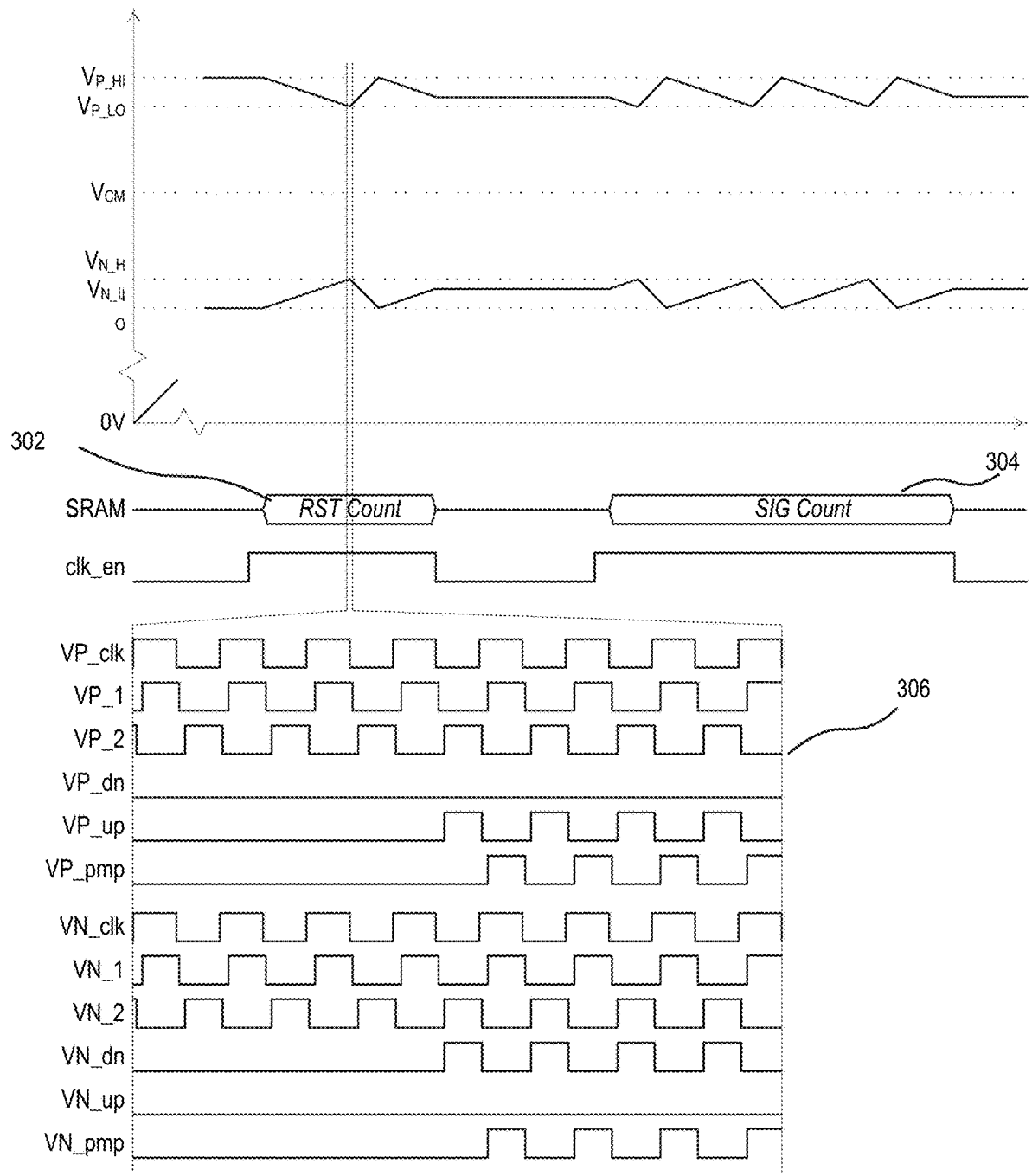
FIG. 3 is a timing diagram of a voltage generation circuit for use in the SRAM of FIG. 2, in embodiments.

FIG. 3 is a timing diagram of a voltage generation circuit for use with SRAM 102 of FIG. 2A, in embodiments. Common mode voltage $V_{CM}$ is sent by a reference current through transistor 224. In embodiments, common mode voltage $V_{CM}$ should be as low as possible, to reduce power usage. However, $V_{CM}$ should be sufficiently larger than the $V_T$ of the transistors 226 and 228, in the latch. This is accomplished by the current source, resistors, and NMOS transistors, and the global reference voltage generator, used to set up $V_{P\_HI}$, $V_{P\_LO}$, $V_{CM}$, $V_{N\_HI}$, and $V_{N\_LO}$. These voltages are used to set up small voltage dead zones for $V_P$ and $V_N$ (for example, 1 mV), so that the charge pump is not continuously running. The charge pump senses its own output voltage, and regulates it with bang-bang control (pump or not). It is possible to sample those reference voltages, to enable turning off the current in the resistor ladder. However, in the high-speed case, this DC current is going to be small compared to the rest of the circuits. Transistor 224 that defines $V_{CM}$ matches the transistors 226 and 228 in the latch 126. Thus, $V_{CM}$ will track the $V_T$ of the latch input devices, and the latch dynamic amplifier discharge current will be proportional to the current used to set up $V_{CM}$. In embodiments, transistors 224, 226 and 228 are NMOS transistors.

Counter high voltage $V_P$ is discharged by gray counter 214 switching between $V_P$ and $V_N$, and charged by charge pump 208 while clk_en signal is high. Counter low voltage is charged by gray counter 214 switching between $V_P$ and $V_N$ and discharged by charge pump 208 while clk_en signal is high. In embodiments, counter low voltage $V_N$ may be initially charged to reach the desired voltage. A snapshot of signal timings internal to charge pump 208 and 210 is shown in 306

Figure 4:
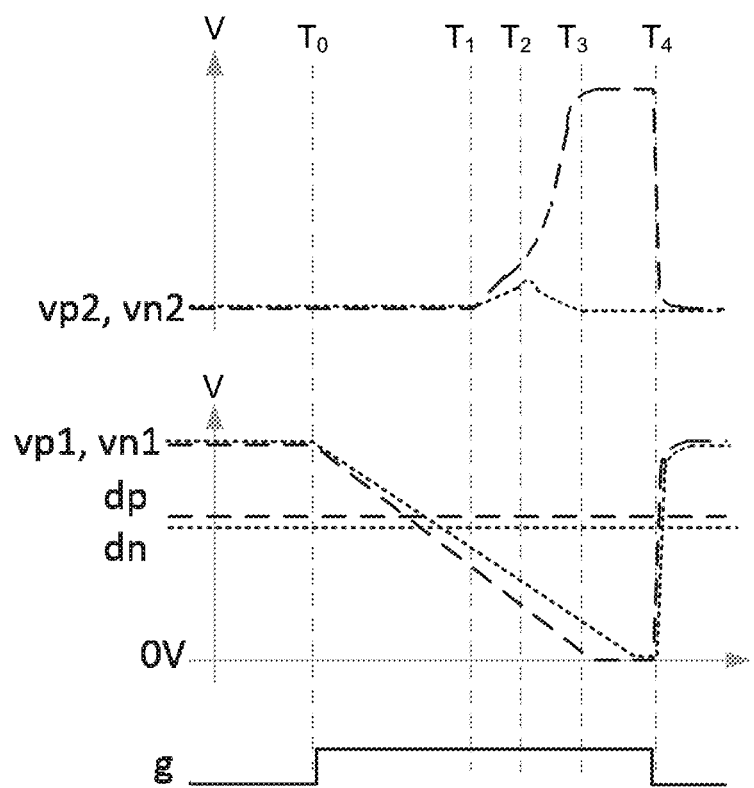
FIG. 4 is timing diagram for updating a latch in a memory cell of the SRAM of FIG. 2, in embodiments.

FIG. 4 is timing diagram for updating a latch in a memory cell of SRAM 102 of FIG. 2A, in embodiments. FIGS. 5A-5D are schematic circuit diagrams illustrating a memory cell of SRAM 102 at different periods of the timing diagram of FIG. 4, in embodiments. FIGS. 4 and 5A-5D are best viewed together in the following discussion.

Figure 5A:
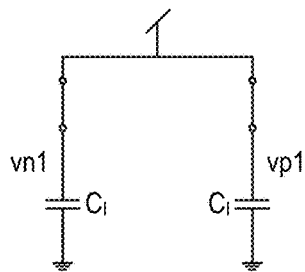
FIGS. 5A-5D are schematic circuit diagrams illustrating a memory cell of the SRAM at different periods of the timing diagram of FIG. 4, in embodiments.

The signal g (g_b) is a clock signal generated by comparator circuit 112. When it is low no current is flowing. The nodes vn1, vp1 in dynamic amplifier 218 of latch 126 are clamped to the voltage supply $V_{DD}$, and nodes vp2, vn2 in regenerative latch 220 are clamped to ground. SR-latch remembers the previous state. This mode is illustrated in FIG. 5A for $t<T_0$ & $t>T_4$.

Figure 5B:
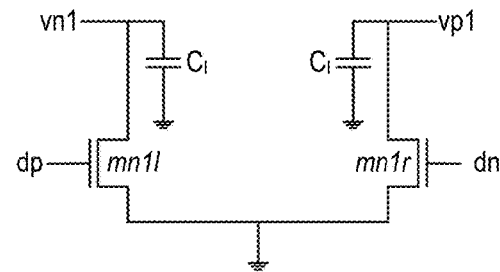

When g changes from low to high, the dynamic amplifier discharges the parasitic capacitances of nodes vp1 and vn1. This mode is illustrated in FIG. 5B for $T_0 \leq t < T_1$. The amount of the discharge current depends on the common mode voltage $V_{CM}$ and the differential input dp and dn. The voltage $V_{CM}$ is set as low as possible to reduce power usage.

Figure 5C:
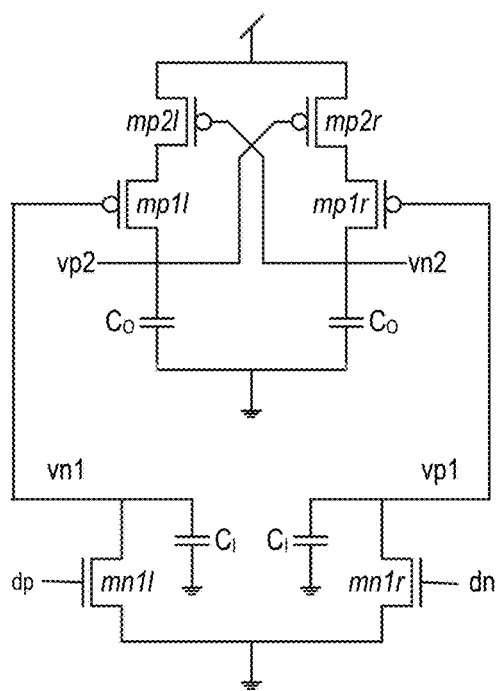

When nodes vp1 and vn1 have discharged enough to turn on the devices 230 and 232, the mode of operation is illustrated in FIG. 5C for $T_1 \leq t < T_2$. This charges nodes vp2 and vn2. In embodiments, devices 230 and 232 are PMOS transistors.

Figure 5D:
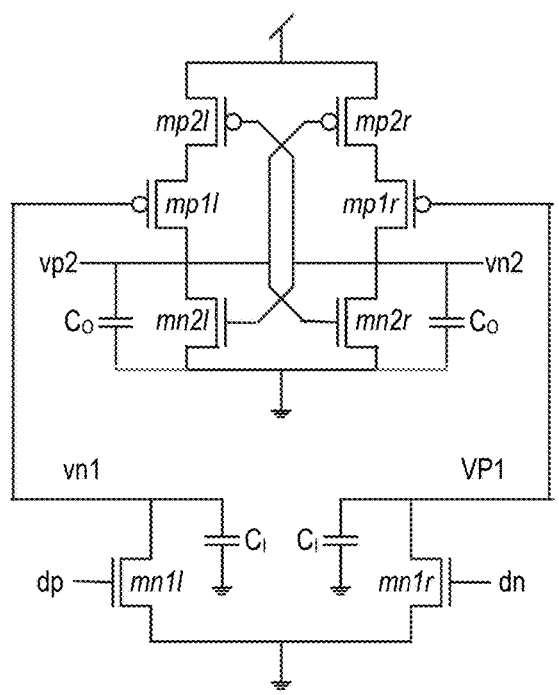

When nodes vp2 and vn2 have charged enough to turn on the devices 234 and 236, the mode of operation is illustrated in FIG. 5D for $T_2 \leq t < T_3$. Regenerative latch 220 will drive vp2 and vn2 to (opposite) logical levels, which will update SR-latch. In embodiments, devices 234 and 236 are NMOS transistors.

The power P given by both equations (1) and (2) are the power consumption when counting (see RST Count 302 and SIG Count 304 in the timing diagram of FIG. 3). Although they represent peak values, the MAX values are useful for comparison.

For purposes of illustration, power will be calculated for representative values of SRAM 102, wherein f=2 GHz, $C_P$=4 pF, $V_{DD}$ is approximately 1V, $V_{CM}$ is approximately 0.5V, $V_P$ is approximately 600 mV and $V_N$ is approximately 500 mV.

$$P_{OLD} = 2 \text{ GHz} \times 4 \text{ pF} \times 1.2 V^2 = 11.52 \text{ mW} \quad (3)$$

$$P_{NEW} = 2 \times 2 \text{ GHz} \times 4 \text{ pF} \times 0.1 V \times 0.5 V = 0.80 \text{ mW} \quad (4)$$

Combinations of Features

Features described above as well as those claimed below may be combined in various ways without departing from the scope hereof. The following enumerated examples illustrate some possible, non-limiting combinations:

(A1) A memory circuit includes a voltage generation circuit for providing a positive supply voltage $V_P$ and a negative supply $V_N$, wherein $V_{DD}>V_p>V_n>V_{gnd}$; a plurality of memory cells coupled to a respective plurality of column sense lines in a pixel array, the plurality of memory cells receiving differential inputs dp and dn; and a Gray counter coupled to switchably couple $V_P$ and $V_N$ to the differential inputs dp and dn of the plurality of memory cells.

(A2) In memory circuit (A1), comprising a plurality of switches for coupling $V_P$ or $V_N$ to differential input dp in accordance with a Gray counter codeword and coupling $V_P$ or $V_N$ to differential input dn in accordance with an inverse of the Gray counter codeword.

(A3) In either of memory circuits (A1)-(A2), $V_P$-$V_N$ is approximately 100 mV.

(A4) In any of memory circuits (A1)-(A3), wherein the voltage generation circuit comprises a source follower or any voltage buffer.

(A5) In any of memory circuits (A1)-(A4), wherein the voltage generation circuit comprises a low-dropout regulator.

(A6) In any of memory circuits (A1)-(A5), wherein the voltage generation circuit comprises charge pump or any switched capacitor circuit.

(A7) In any of memory circuits (A1)-(A6), wherein $V_P$ and $V_N$ are generated from $V_{CM}$, wherein $V_{CM}=V_T+V_{OV}$, $V_{CM}$ is a common mode voltage, and $V_T$ and $V_{OV}$ are defined by a voltage generation transistor that matches input transistors in an input latch of the plurality of memory cells.

(A8) In any of memory circuits (A1)-(A7), wherein the Gray counter counts on each clock transition.

(B1) An image sensor includes a plurality of image pixels arranged in rows and columns of a pixel array; a voltage generation circuit for providing a positive supply voltage VP and a negative supply VN, wherein VDD>Vp>Vn>Vgnd; and a low power SRAM comprising: a plurality of memory cells coupled to a respective plurality of columns in a pixel array, the plurality of memory cells receiving differential inputs dp and dn; and a Gray counter for switchably coupling VP and VN to the differential inputs dp and dn of the plurality of memory cells.

(B2) In the image sensor of (B1), further comprising a plurality of switches for coupling $V_P$ or $V_N$ to differential input dp in accordance with a Gray counter codeword and coupling $V_P$ or $V_N$ to differential input dn in accordance with an inverse of the Gray counter codeword.

(B3) In either of the image sensors of (B1) or (B2), wherein $V_P$-$V_N$ is approximately 100 mV.

(B4) In any of image sensors (B1)-(B3), wherein the voltage generation circuit comprises a source follower or any voltage buffer.

(B5) In any of image sensors (B1)-(B4), wherein the voltage generation circuit comprises a low-dropout regulator.

(B6) In any of image sensors (B1)-(B5), wherein the voltage generation circuit comprises charge pump or any switched capacitor circuit.

(B7) In any of the image sensors of (B1)-(B6), wherein $V_P$ and $V_N$ are generated from $V_{CM}$, wherein $V_{CM}=V_T+V_{OV}$, $V_{CM}$ is a common mode voltage, and $V_T$ and $V_{OV}$ are defined by a voltage generation transistor that matches input transistors in an input latch of the plurality of memory cells.

(C1) A method of operating an image sensor comprising image pixels arranged in rows and columns of a pixel array, and a low power SRAM comprising a plurality of memory cells coupled to corresponding columns of image pixels in the pixel array, the plurality of memory cells receiving differential inputs dp and dn; a voltage generation circuit for providing a positive supply voltage VP and a negative supply $V_N$ and a Gray counter, the method comprising: acquiring an image by the image pixels; generating $V_P$ and $V_N$ such that $V_{DD}>V_P>V_N>V_{gnd}$; receiving an output g of a column of pixels at a clock input of a memory cell; and switchably coupling $V_P$ and $V_N$ to the differential inputs dp and dn of the plurality of memory cells according to a codeword from the Gray counter.

(C2) In the method of (C1), wherein $V_P$ and $V_N$ are generated from $V_{CM}$, wherein $V_{CM}=V_T+V_{OV}$, $V_{CM}$ is a common mode voltage, and $V_T$ and $V_{OV}$ are defined by a voltage generation transistor that matches input transistors in an input latch of the plurality of memory cells.

(C3) In either of the methods of (C1) or (C2), wherein $V_P$ and $V_N$ are generated using a voltage generation circuit comprising a source follower, any voltage buffer or a low-dropout regulator.

(C4) In the method of (C3), wherein, wherein $V_P$ and $V_N$ are generated using a voltage generation circuit comprising a charge pump or any switched capacitor circuit.

(C5) In the method of (C4), wherein $V_P$-$V_N$ is approximately 100 mV.

Changes may be made in the above methods and systems without departing from the scope hereof. It should thus be noted that the matter contained in the above description or shown in the accompanying drawings should be interpreted as illustrative and not in a limiting sense. Herein, and unless otherwise indicated: (a) the adjective "exemplary" means serving as an example, instance, or illustration, and (b) the phrase "in embodiments" is equivalent to the phrase "in certain embodiments," and does not refer to all embodiments. The following claims are intended to cover all generic and specific features described herein, as well as all statements of the scope of the present method and system, which, as a matter of language, might be said to fall therebetween.

What is claimed is:

1. A memory circuit comprising:
   a voltage generation circuit for providing a positive supply voltage $V_P$ and a negative supply $V_N$, wherein $V_{DD}>V_P>V_N>V_{gnd}$;
   a plurality of memory cells coupled to a respective plurality of column sense lines in a pixel array, the plurality of memory cells receiving differential inputs dp and dn; and
   a Gray counter coupled to switchably couple $V_P$ and $V_N$ to the differential inputs dp and dn of the plurality of memory cells.

2. The memory circuit of claim 1, further comprising a plurality of switches for coupling $V_P$ or $V_N$ to differential input dp in accordance with a Gray counter codeword and coupling $V_P$ or $V_N$ to differential input dn in accordance with an inverse of the Gray counter codeword.

3. The memory circuit of claim 1, wherein $V_P$-$V_N$ is approximately 100 mV.

4. The memory circuit of claim 1, wherein the voltage generation circuit comprises a source follower or voltage buffer.

5. The memory circuit of claim 1, wherein the voltage generation circuit comprises a low-dropout regulator.

6. The memory circuit of claim 1, wherein the voltage generation circuit comprises a charge pump or switched capacitor circuit.

7. The memory circuit of claim 1, wherein $V_P$ and $V_N$ are generated from $V_{CM}$, wherein $V_{CM}=V_T+V_{OV}$, $V_{CM}$ is a common mode voltage, and $V_T$ and $V_{OV}$ are defined by a voltage generation transistor that matches input transistors in an input latch of the plurality of memory cells.

8. The memory circuit of claim 1, wherein the Gray counter counts on each clock transition.

9. An image sensor comprising:
   a plurality of image pixels arranged in rows and columns of a pixel array;
   a voltage generation circuit for providing a positive supply voltage $V_P$ and a negative supply $V_N$, wherein $V_{DD}>V_P>V_N>V_{gnd}$; and
   a low power SRAM comprising:
      a plurality of memory cells coupled to a respective plurality of columns in a pixel array, the plurality of memory cells receiving differential inputs dp and dn; and
      a Gray counter for switchably coupling $V_P$ and $V_N$ to the differential inputs dp and dn of the plurality of memory cells.

10. The image sensor of claim 9, further comprising a plurality of switches for coupling $V_P$ or $V_N$ to differential input dp in accordance with a Gray counter codeword and coupling $V_P$ or $V_N$ to differential input dn in accordance with an inverse of the Gray counter codeword.

11. The image sensor of claim 9, wherein $V_P-V_N$ is approximately 100 mV.

12. The image sensor of claim 9, wherein the voltage generation circuit comprises a source follower or voltage buffer.

13. The image sensor of claim 9, wherein the voltage generation circuit comprises a low-dropout regulator.

14. The image sensor of claim 9, wherein the voltage generation circuit comprises a charge pump or a switched capacitor circuit.

15. The image sensor of claim 9, wherein $V_P$ and $V_N$ are generated from $V_{CM}$, wherein $V_{CM}=V_T+V_{OV}$, $V_{CM}$ is a common mode voltage, and $V_T$ and $V_{OV}$ are defined by a voltage generation transistor that matches input transistors in an input latch of the plurality of memory cells.

16. A method of operating an image sensor comprising image pixels arranged in rows and columns of a pixel array, and a low power SRAM comprising a plurality of memory cells coupled to corresponding columns of image pixels in the pixel array, the plurality of memory cells receiving differential inputs dp and dn; a voltage generation circuit for providing a positive supply voltage $V_P$ and a negative supply $V_N$ and a Gray counter, the method comprising:
   acquiring an image by the image pixels;
   generating $V_P$ and $V_N$ such that $V_{DD}>V_P>V_N>V_{gnd}$;
   receiving an output g of a column of pixels at a clock input of a memory cell; and
   switchably coupling $V_P$ and $V_N$ to the differential inputs dp and dn of the plurality of memory cells according to a codeword from the Gray counter.

17. The method of claim 16, wherein $V_P$ and $V_N$ are generated from $V_{CM}$, wherein $V_{CM}=V_T+V_{OV}$, $V_{CM}$ is a common mode voltage, and $V_T$ and $V_{OV}$ are defined by a voltage generation transistor that matches input transistors in an input latch of the plurality of memory cells.

18. The method of claim 16, wherein $V_P$ and $V_N$ are generated using a voltage generation circuit comprising a source follower, voltage buffer or low-dropout regulator.

19. The method of claim 16, wherein, wherein $V_P$ and $V_N$ are generated using a voltage generation circuit comprising a charge pump or a switched capacitor circuit.

20. The method of claim 16, wherein $V_P-V_N$ is approximately 100 mV.

* * * * *